United States Patent [19]

Yoshida et al.

[11] Patent Number: 5,305,944
[45] Date of Patent: Apr. 26, 1994

[54] BONDING METHOD AND BONDING APPARATUS

[75] Inventors: Masaharu Yoshida; Yasufumi Nakasu; Masataka Takehara, all of Fukuoka, Japan

[73] Assignee: Mitsubishi Denki Kabushiki Kaisha, Tokyo, Japan

[21] Appl. No.: 40,249

[22] Filed: Mar. 30, 1993

[30] Foreign Application Priority Data

Apr. 23, 1992 [JP] Japan .................. 4-104249

[51] Int. Cl.$^5$ ............................... H05K 3/34
[52] U.S. Cl. ................. 228/180.22; 228/102; 228/234.1
[58] Field of Search ............ 228/102, 108.2, 212, 228/7, 44.7, 123.1, 242

[56] References Cited

U.S. PATENT DOCUMENTS 4,364,508 12/1982 Lazzery et al. ................ 228/180.2
5,017,170 5/1991 Daugherty et al. ............ 228/242

FOREIGN PATENT DOCUMENTS 64-38784 2/1989 Japan .
2-264444 10/1990 Japan .

OTHER PUBLICATIONS

IBM Technical Disclosure, "Direct Chip Attach to Flex Substrates", vol. 34, No. 11, pp. 362, 363, Apr. 1992.

Primary Examiner—Samuel M. Heinrich
Attorney, Agent, or Firm—Lowe, Price, LeBlanc & Becker

[57] ABSTRACT

A bonding apparatus according to the present invention bonds a semiconductor chip to a conductive member in the face-down style without heating the semiconductor chip. The semiconductor chip which consists essentially of silicon is placed on leads which are put on a TAB tape. A glass plate member is mounted on the semiconductor chip. An infrared light beam is irradiated onto the semiconductor chip from above the semiconductor chip. Transmitted by the semiconductor chip, the infrared light beam illuminates bumps. As a result, the bumps heat up and melt. Since the semiconductor chip does not absorb the infrared light beam, bonding of the semiconductor chip to the leads does not cause a rise in temperature of the semiconductor chip. The bonding apparatus according to the present invention makes the face-down style bonding possible.

24 Claims, 12 Drawing Sheets

BONDING METHOD AND BONDING APPARATUS

BACKGROUND OF THE INVENTION

1. Field of the Invention

The present invention relates to an improved technique for bonding a semiconductor chip to a conductive member such as a lead and a land pattern.

2. Description of the Prior Art

Figure 1:
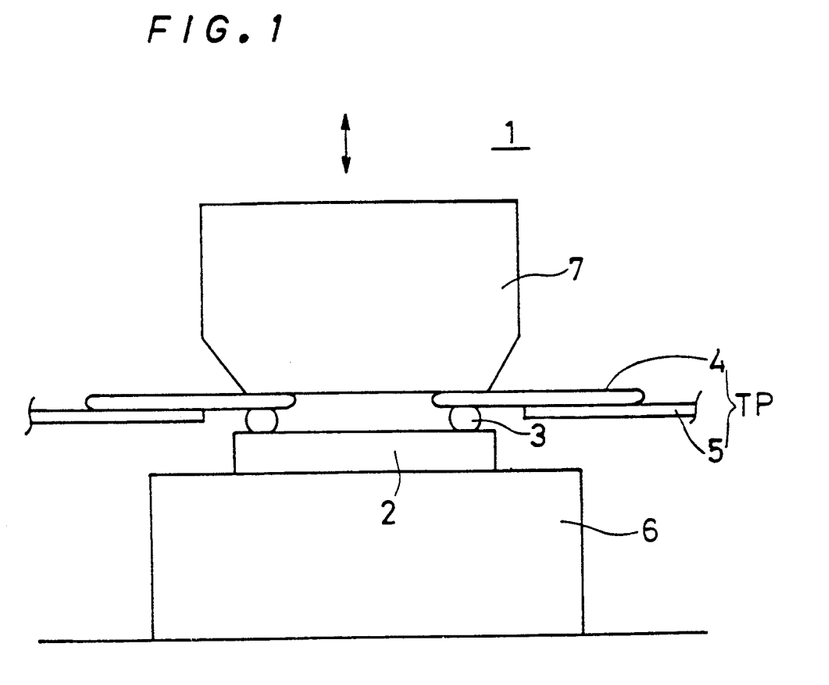
FIG. 1 is a schematic view of a conventional bonding apparatus.

An apparatus 1 such as that shown in FIG. 1 is widely used to bond a semiconductor chip to a conductive lead by the TAB bonding method.

The apparatus 1 includes a pressure tool 7 which houses a heating mechanism, and a pedestal 6. Bonding using the apparatus 1 involves mounting a semiconductor chip 2 on the pedestal 6 and placing leads 4 on bumps 3 in registry therewith. A TAB tape TP is formed by an insulation tape 5 and the leads 4 adhered on the insulation tape 5. With the semiconductor chip 2 mounted on the pedestal 6 and the leads 4 registered onto the bumps 3, the heated pressure tool 7 pushes the leads 4 downwards. The heat of the pressure tool 7 flows to the bumps 3, thereby melting the bumps 3. The melted bumps 3 then cools down and hardens. As a result, the semiconductor chip 2 is bonded to the leads 4.

Although the bumps 3 are exaggerated regarding the thickness in FIG. 1, in reality, the bumps 3 are quite thin. Hence, when the semiconductor chip 2 is pushed downwards by the heated pressure tool 7, top surface of the semiconductor chip 2 is spaced from the bottom face of the pressure tool 7 by substantially no distance. Due to this, the conventional bonding process as above permits the heat of the tool 7 to be transferred in a considerable amount to the semiconductor chip 2 via the leads 4 and the bumps 3.

This in turn causes the temperature of the semiconductor chip 2 to jump up, which will deteriorate electrical and other characteristics of the semiconductor chip 2.

Further, bonding using the apparatus 1 of FIG. 1 requires that the semiconductor chip 2 is placed below the leads 4, i.e., in a face-up relation to the leads 4. This is because if the leads 4 are placed below the semiconductor chip 2, heat of the tool 7 will have to pass through the semiconductor chip 2 on the way to the bumps 3 and will inevitably cause an enormous increase in temperature of the semiconductor chip 2.

For the reason immediately above, it is not a practical choice to bond the semiconductor chip 2 with its bonding surface down, i.e., in the face-down style, by the apparatus 1 of FIG. 1.

SUMMARY OF THE INVENTION

The present invention is directed to a method of bonding a semiconductor chip to an object to be bonded, the semiconductor chip having first and second major surfaces, the object to be bonded including a conductive member, the method comprising the steps of: (a) supporting the object to be bonded and the semiconductor chip in such a manner that the first major surface of the semiconductor chip is faced with the conductive member through a bump interposed therebetween; and (b) illuminating an infrared light beam from a second major surface side of the semiconductor chip onto the bump through the semiconductor chip.

The step (b) preferably includes the steps of: (b-1) generating the infrared light beam; and (b-2) deflecting the infrared light beam towards the bump.

An array of bumps may be formed on the first major surface of the semiconductor chip. The step (b) may further include a step of (b-3) scanning the infrared light beam on the bumps one by one serially.

The step (b-3) may include a step of (b-3-1) enabling the infrared light beam during first periods in which the infrared light beam is irradiated onto either one of the bumps and disabling the infrared light beam during second periods in which the infrared light beam is moving between the bumps.

The step (b) preferably further includes a step of (b-4) pressing the semiconductor chip towards the conductive member before the steps (b-1) and (b-2).

The step (b) preferably further includes a step of (b-5) converging the infrared light beam by a converging optical system onto the array of the bumps.

The step (b-5) may further include a step of (b-5-1) converging the infrared light beam so that on the bumps, the infrared light beam has a diameter equal to or smaller than the diameter of each of the bumps.

The step (b-5-1) may further include a step of converging the infrared light beam so that on the bumps, the infrared light beam has a smaller diameter than the diameter of each of the bumps, and wherein the step (b-3-1) includes a step of (b-3-1a) two-dimensionally scanning the infrared light beam on each of the bumps during the first periods.

The method may further comprise a step of (d) moving a plate member which is made of a material which transmits the infrared light beam and mounting the plate member on the second surface of the semiconductor chip before the step (b).

The step (a) may include a step of (a-1) mounting the object to be bonded and the semiconductor chip on a support member which is made of a material which transmits or absorbs the infrared light beam.

The object to be bonded may include an insulation tape and a plurality of leads which are placed on the insulation tape and wherein the conductive member is the plurality of leads.

The object to be bonded may include an insulation substrate and a conductive pattern which is formed on the insulation substrate and wherein the conductive member is the conductive pattern.

The present invention is also directed to a boding apparatus for bonding a semiconductor chip which consists essentially of silicon to an object to be bonded which includes a conductive member, the semiconductor chip having first and second major surfaces, comprising: (a) support means for supporting the object to be bonded and the semiconductor chip in such a manner that the first major surface of the semiconductor chip is faced with the conductive through a bump interposed therebetween; and (b) infrared light beam illumination means for illuminating an infrared light beam from a second major surface side of the semiconductor chip onto the bump through the semiconductor chip.

The infrared light beam illumination means preferably includes: (b-1) infrared light beam generation means for generating the infrared light beam; and (b-2) beam deflection means for deflecting the infrared light beam towards the bump.

An array of bumps may be formed on the first major surface of the semiconductor chip. The bonding apparatus may further comprise (c) control means for giving a deflection control signal to the beam deflection means to thereby scan the infrared light beam on the plurality of bumps one by one serially.

The control means preferably includes (c-1) means for generating a timing signal which is in synchronism with the deflection control signal and for giving the timing signal to the infrared light beam generation means so that the infrared light beam is enabled during first periods in which the infrared light beam is irradiated onto either one of the bumps and disabled during second periods in which the infrared light beam is moving between the bumps.

The infrared light beam illumination means may further include: (b-3) an optical head disposed in an opposed relation with the second major surface of the semiconductor chip, the optical head emitting the infrared light beam which has been deflected by the beam deflection means towards the second major surface of the semiconductor chip; (b-4) an elastic member attached to the optical head at a location off the optical path of the infrared light beam, the elastic member projecting towards the second major surface of the semiconductor chip; and (b-5) a mechanism for protracting and detracting the optical head towards and backwards from the second major surface of the semiconductor chip.

The infrared light beam generation means preferably includes: (b-1-1) an infrared light beam source for generating the infrared light beam; and (b-1-2) a converging optical system for converging the infrared light beam onto each of the bumps.

The converging optical system may include (b-1-2a) an optical element for converging the infrared light beam so that on the bumps, the infrared light beam has a diameter equal to or smaller than the diameter of each of the bumps.

The optical system preferably converges the infrared light beam so that on the bumps, the infrared light beam has a smaller diameter than the diameter of each of the bumps and wherein the control means includes (c-2) means for generating a deflection control signal under the control of which the infrared light beam is scanned on each of the bumps two-dimensionally during the first periods.

The bonding apparatus preferably further comprising a mechanism (d) which includes: (d-1) a plate member which is made of a material which transmits the infrared light beam, the plate member being mountable on the second surface of the semiconductor chip; and (d-2) an actuator for moving the plate member onto the second surface of the semiconductor chip.

The support means preferably includes (a-1-1) a support member which is made of a material which transmits or absorbs the infrared light beam, the plate member mounting thereon the object to be bonded.

In an aspect of apparatus, the object to be bonded includes an insulation tape and a plurality of leads which are placed on the insulation tape and wherein the conductive member is the plurality of leads.

The object to be bonded may otherwise include an insulation substrate and a conductive pattern which is formed on the insulation substrate and wherein the conductive member is the conductive pattern.

As hereinabove described, the present invention utilizes the nature of infrared light that infrared light is transmitted by silicon. That is, though the infrared light beam is illuminated onto the bumps through the semiconductor chip, the semiconductor chip transmits the infrared light beam. Hence, while the bumps heat up and melt, the temperature of the semiconductor chip will not largely increase. This allows that leads are bonded to even a semiconductor device which is not highly heat-resistive without causing any problem.

Since it is not necessary to press a heated pressure tool against the semiconductor chip, the face-down bonding is made possible.

In addition, by deflecting the infrared light beam and illuminating the same onto the bumps, unwanted infrared illumination onto off the bumps can be decreased. By irradiating the infrared light beam onto the bumps serially one by one to bond the leads, the leads can be bonded by the bumps without using a plurality of infrared light beams. Thus, various different bonding process in which the bumps are located differently are made possible only by deflecting the infrared light beam.

In serially scanning the infrared light beam onto the bumps, the scanning position and timing of the scanning are changed. Hence, the present invention is adaptive to different chips with different bump arrangements, and therefore, has a wide range of applications. Further, means for generating a number of infrared light beams is not needed.

In either cases, the object to be bonded needs not to be transparent to the infrared light beam, which is also a reason for the wide range of applications of the present invention.

Accordingly, it is an object of the present invention to achieve less temperature increase of a semiconductor chip whose base member is silicon during bonding of the semiconductor chip to a conductive member.

It is also an object of the present invention to establish a technique for bonding a semiconductor chip, bonding surface down, to a conductive member without causing heating up of the semiconductor chip.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 2:
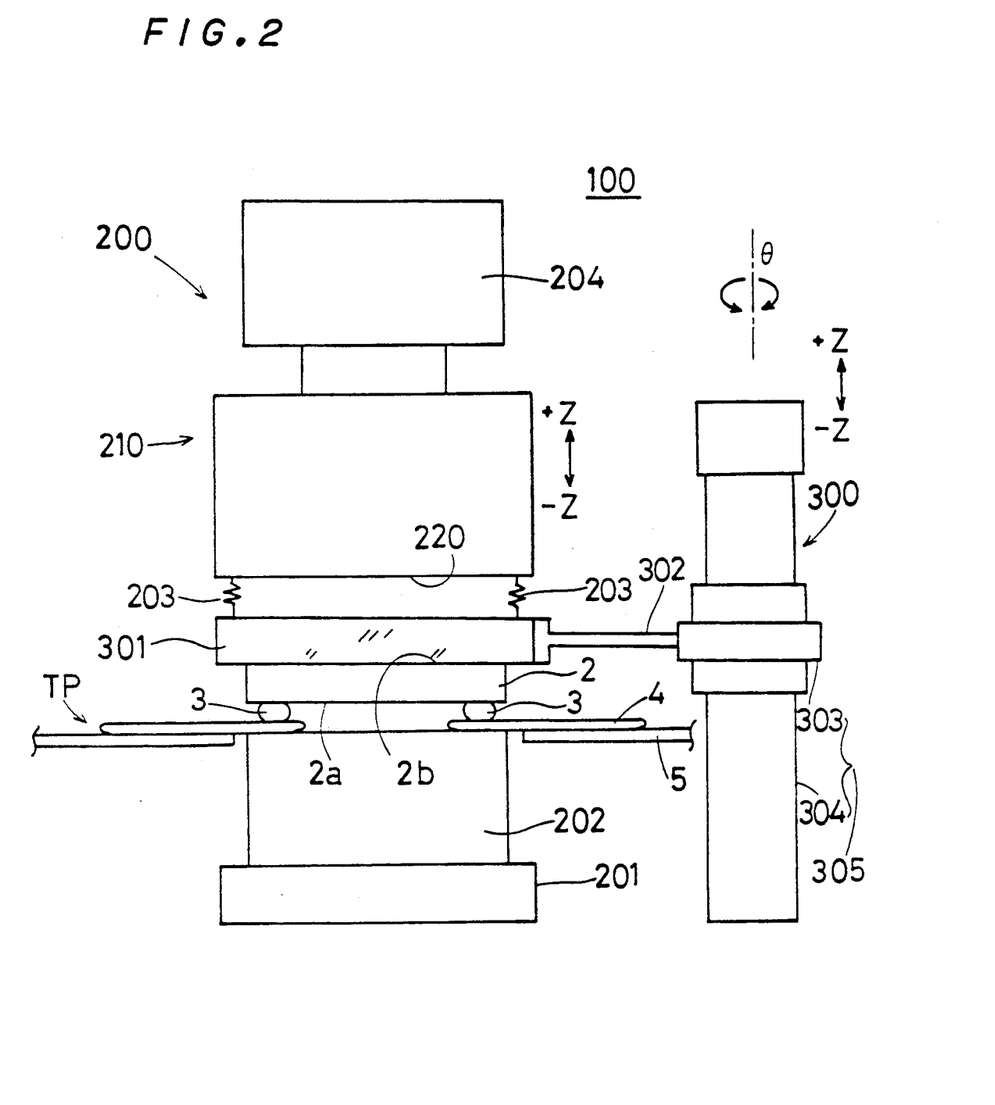
FIG. 2 is a schematic view of a bonding apparatus according to a first preferred embodiment of the present invention.

FIG. 2 is a view of a bonding apparatus 100 according to a first preferred embodiment of the present invention. The bonding apparatus 100 is an apparatus for bonding a semiconductor chip 2 to a plurality of leads 4 by TAB the bonding method. The details about the bonding apparatus 1 will be described below.

Object to be Bonded

Figure 3:
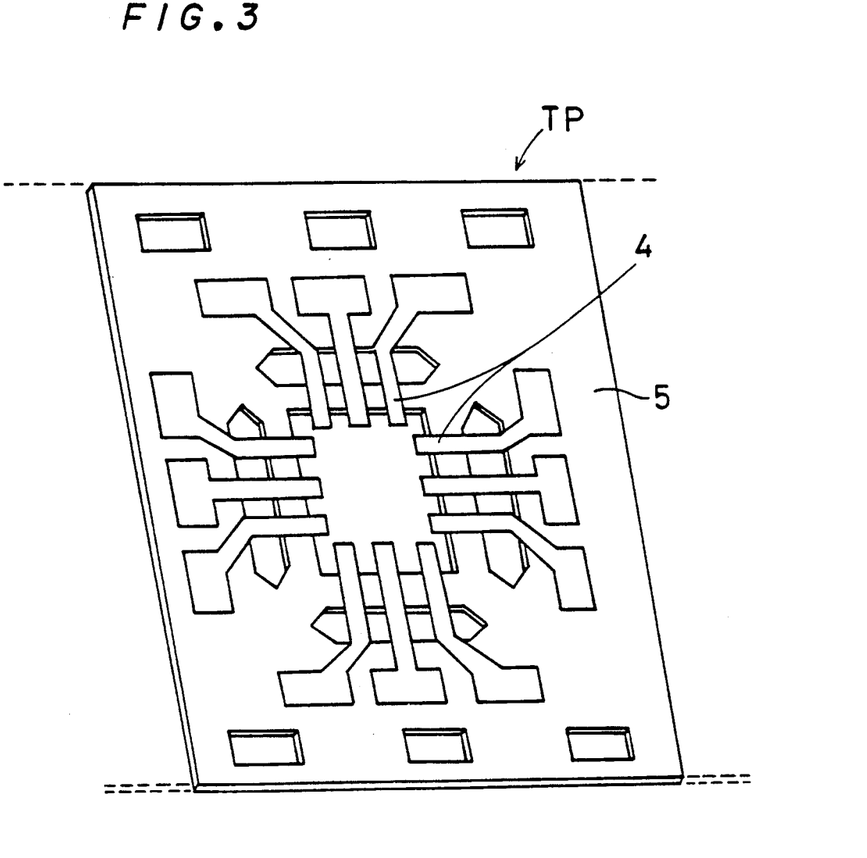
FIG. 3 is a view showing leads as they are attached to an insulation tape by the TAB method.

As shown in FIG. 3, the leads 4 are adhesively put on an insulation tape 5, forming a TAB tape TP. Although FIG. 3 shows a relatively small number of the leads 4 for clarity of description, the insulation tape 5 is often provided with more leads 4 in reality. In addition, although FIG. 3 shows only a unit structure of the TAB tape TP, in fact, a plurality of the same unit structures are arranged in the direction of the dotted lines. Such a TAB tape TP is "an object to be bonded" in the first preferred embodiment.

Figure 9:
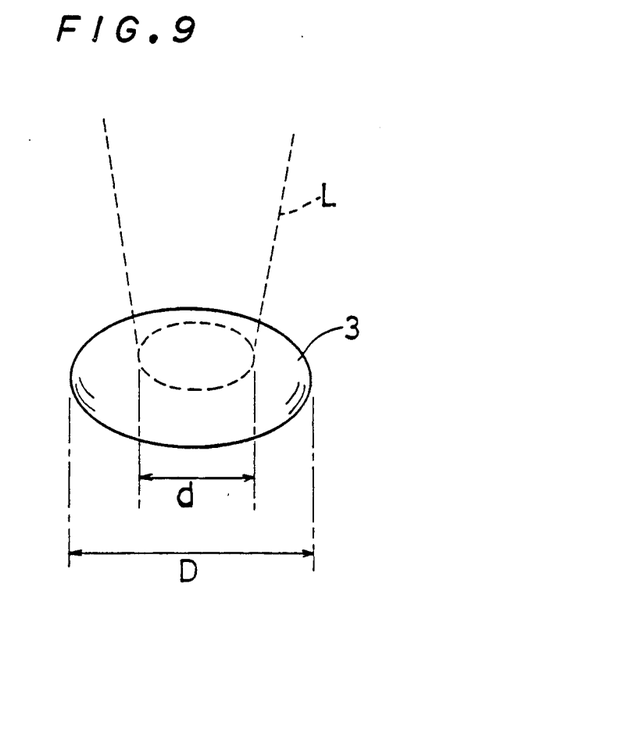
FIG. 9 is a view showing a bump as being irradiated by an infrared light beam.

A polysilicon substrate is used as a base member for the semiconductor chip 2. The semiconductor chip 2 is provided on its first major surface 2a with a plurality of bumps 3 as shown in FIG. 9. After bonded to the leads 4 by a structure which will be described later in a manner which will be described later, the semiconductor chip 2 is separated, altogether with the leads 4 bonded thereto, from the insulation tape 5 by pushing action onto the leads 4 from the rear side of the tape 5 through cut out portions of the leads 4.

Overall Structure of Apparatus

The apparatus 100 of FIG. 2 is comprised of a body 200 and a chip press mechanism 300.

The body 200 includes a support member 202 which is attached on a base member 201. The support member 202 is made of a material which transmits or absorbs infrared light. In the embodiment herein described, the support member 202 is made of glass.

First, the TAB tape TP, in which a plurality of the leads 4 are adhesively put on the insulation tape 5, is placed on the support member 202 (described later). On the other hand, the semiconductor chip 2, which is to be bonded to the leads 4, is set on the leads 4 through the bumps 3. In other words, the TAB tape TP and the semiconductor chip 2 are placed on, with the bumps 3 interposed therebetween, and supported by the support 202. Again, though drawn as being quite thick for clarity of description, the bumps 3 are very thin in reality.

Figure 8:
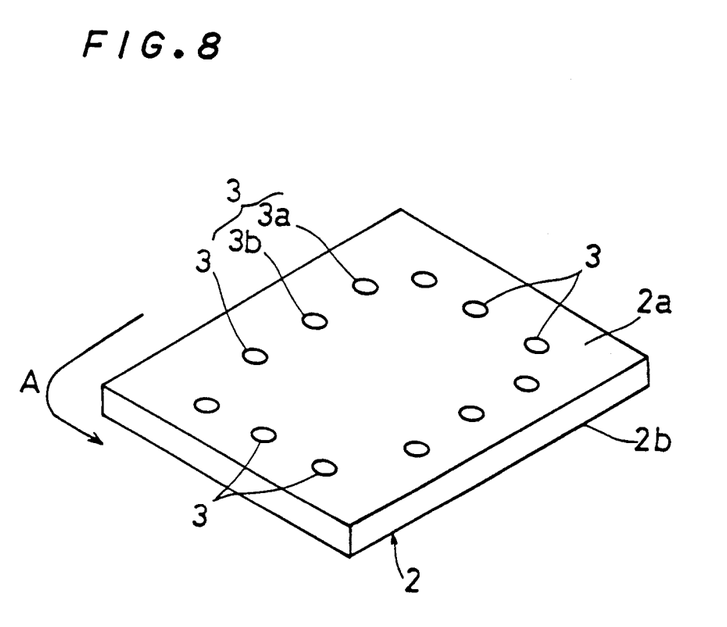
FIG. 8 is a view showing how bumps are formed on a semiconductor chip.

It is also to be noted that the semiconductor chip 2 is set with its first major surface 2a down during bonding as shown in FIG. 2, although the first major surface 2a is directed upwards in FIG. 8. That is, the first major surface 2a at which the semiconductor chip 2 is to be bonded to the leads 4, or the bonding surface of the semiconductor chip 2, is directed downwards. Thus, the apparatus 100 of FIG. 2 is suitable for the dace-down bonding process.

In FIG. 2, a plate member 301 made of a material which transmits infrared light is placed on a second major surface 2b of the semiconductor chip 2. As herein considered, the plate member 301 is made from a transparent glass plate. The plate member 301 is a part of the chip press mechanism 300 as described in detail later.

Supported from above by a protract-retract mechanism 204, an infrared light illumination device 210 is located above the support member 202. The protract-retract mechanism 204 is equipped with a function to move the infrared light illumination device 210 in the directions +Z and −Z of FIG. 2.

A bottom portion of the infrared light illumination device 210 is an optical head 220. The optical head 220 includes an element for generating an infrared light beam and for directing it downwards, i.e., towards the bottom margin of FIG. 2 (described later).

Figure 5:
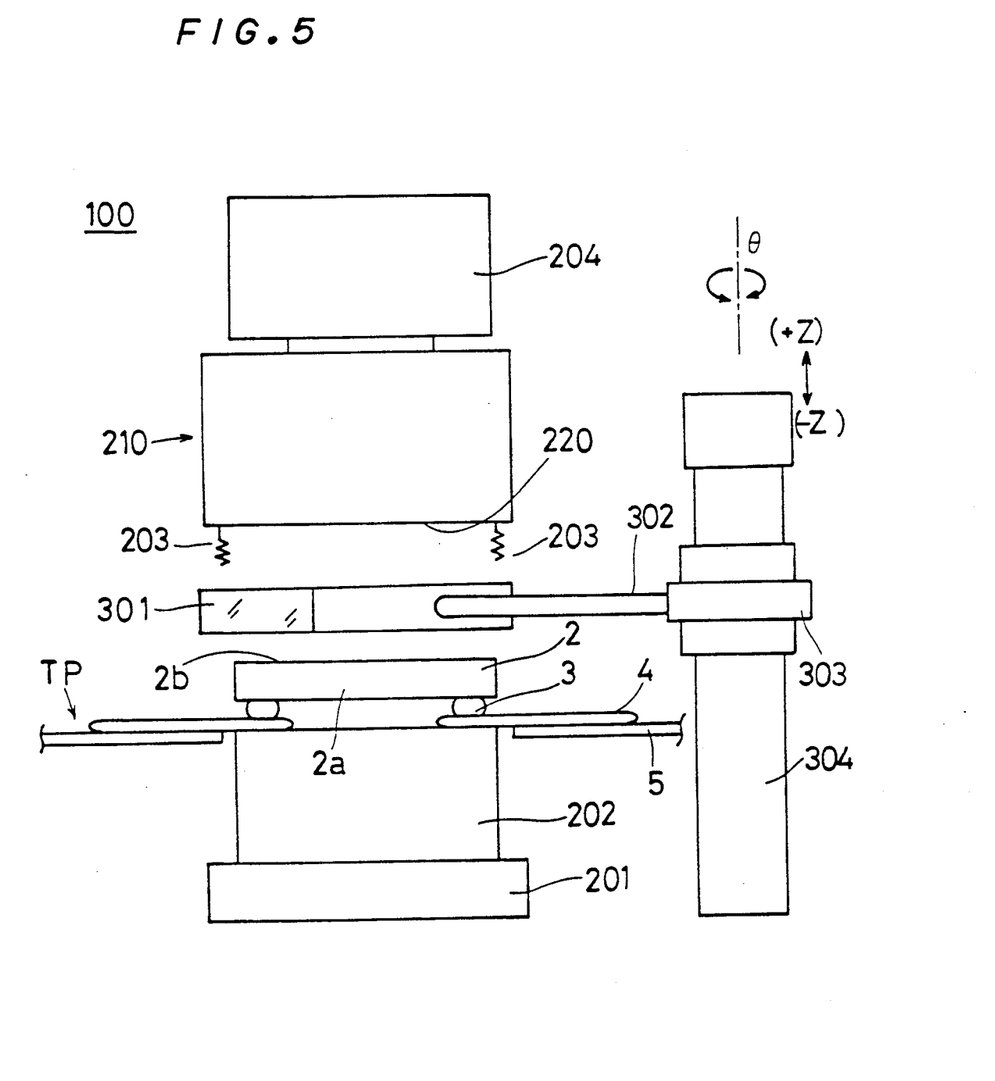
FIGS. 5 and 6 are schematic views showing action of the apparatus of the first preferred embodiment of the present invention.

A plurality of springs 203 are attached at top ends to the bottom surface of the optical head 220 each at such a location off an optical path of the infrared light beam. The springs 203 are preferably arranged in a peripheral portion of the optical head 220 and have substantially the same spring constant and the same length. As shown in FIG. 5 (described later), the bottom ends of the springs 203 are free ends.

The chip press mechanism 300 includes the plate member 301 which has a horizontal major surface and a horizontal arm 302 which is fixed to a side of the plate member 301.

Figure 4:
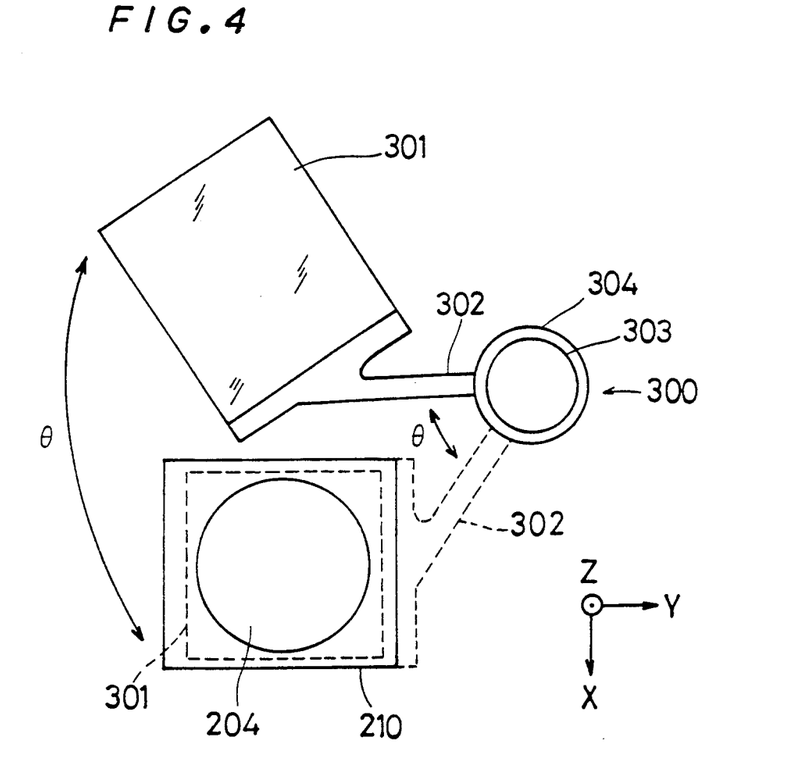
FIG. 4 is a view showing action of a plate member.

The horizontal arm 302 is linked to an actuator 305. The actuator 305 is slidable along a vertical post 304 in the directions +Z and −Z and equipped with a drive element 303 which is rotatable in the direction Θ. FIG. 4 is a schematic view showing in the X-Y plane how the plate member 301 rotates with the Θ-direction rotation of the drive element 303. Timing of the rotation will be described later.

Overall Operation

The apparatus 100 constructed as above bonds the semiconductor chip 2 to the leads 4 in the following manner.

Prior to feeding of the TAB tape TP and the semiconductor chip 2 onto the support member 202, the plate member 301 is not situated above the support member 202 (i.e., at release position) as shown by dotted lines in the X-Y plane in FIG. 3. The infrared light illumination device 210 is, driven by the protract-retract mechanism 204, retracted above.

Having moved the plate member 301 to the release position, the TAB tape TP is mounted, with the leads 4 up, on the support member 202. The semiconductor chip 2 seating the bumps 3 on its surface is then placed on the TAB tape TP such that the bumps 3 and ends of the leads 4 are registered to each other. The bonding process at this point is illustrated in FIG. 5. As shown in FIG. 5, the second major surface 2b of the semiconductor chip 2 is directed upwards. The plate member 301 is located beyond the semiconductor chip 2 in the direction perpendicular to the plane of the drawing.

Following this, the drive member 303 is rotated in the direction Θ, to thereby horizontally slide the plate member 301 to right above the semiconductor chip 2. The plate member 301 as having been horizontally moved is shown by solid lines in FIG. 4.

Figure 6:
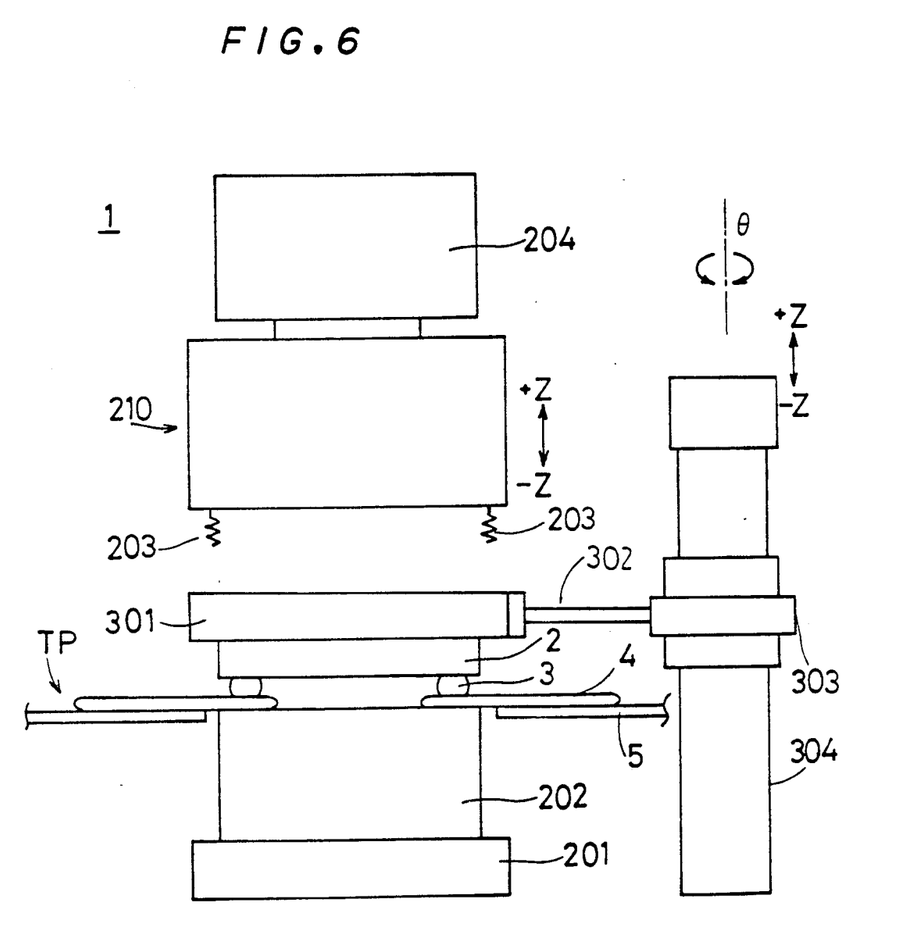

The drive element 303 then slides down along the vertical post 304. The plate member 301 also slides down with the downwards movement of the drive element 303 and stops moving downwards when it comes into contact with the second major surface 2b of the semiconductor chip 2. At this stage, which is best illustrated in FIG. 6, the plate member 301 applies almost no pressure onto the semiconductor chip 2.

Next, the protract-retract mechanism 204 moves the infrared light illumination device 210 downwards, the springs 203 thereby touching at the bottom ends the second major surface 2b of the semiconductor chip 2. The infrared light illumination device 210 is moved downwards a little further and then stopped. At this stage, the apparatus 100 is in a condition as that shown in FIG. 2 in which the springs 203 bias the semiconductor chip 2 against the leads 4. The downward-slide-stop positions of the plate member 301 and the infrared light illumination device 210 may be determined beforehand.

With the semiconductor chip 2 thus biased against the leads 4, the infrared light illumination device 210 irradiates an infrared light beam onto the bumps 3. Detailed structure and operations of the infrared light illumination device 210 will be described later.

The semiconductor chip 2 consists essentially of silicon, which transmits infrared light. Infrared light is also transmitted by the plate member 301 which is, as mentioned before, made of a material which transmits infrared light. Hence, the infrared light beam from the infrared light illumination device 210 passes through the plate member 301 and the semiconductor chip 2 and strikes the bumps 3. The bumps 3 are made of a solder, for instance, which absorbs infrared light. Irradiated by the infrared light beam, therefore, the bumps 3 heat up and melt to bond the semiconductor chip 2 to the leads 4. Increase in temperature of the bumps 3 and resultant transfer of a portion of the heat of the bumps 3 into the semiconductor chip 2 would not cause almost no rise in temperature of the semiconductor chip 2, since the bumps 3 occupy only a small area of the first major surface 2a of the semiconductor chip 2 and hence the heat which will be transferred to the semiconductor chip 2 is very little.

The infrared light beam is thereafter turned off, allowing the bumps 3 to cool down and harden by itself. Having thus bonded the leads 4 to the semiconductor chip 2, the protract-retract mechanism 204 retreats the infrared light illumination device 210 upwards, followed by slide up of the drive element 303 along the vertical post 304 and hence of the plate member 301. This completes bonding of one semiconductor chip 2 and the leads 4.

Remaining other semiconductor chips undergo similar procedures. After finishing bonding for all the semiconductor chips 2, the semiconductor chips 2 and the TAB tape TP are discharged out of the apparatus 100.

Detailed Description of Infrared Light Illumination Device

The infrared light illumination device 210 may be a selective illumination type device which selectively illuminates an infrared light beam exclusively onto only the bumps 3, or may be a total illumination type device which irradiates the semiconductor chip 2 entirely at the major surfaces 2a and 2b. The two types will be each described below.

a. Selective Illumination Type

Figure 7:
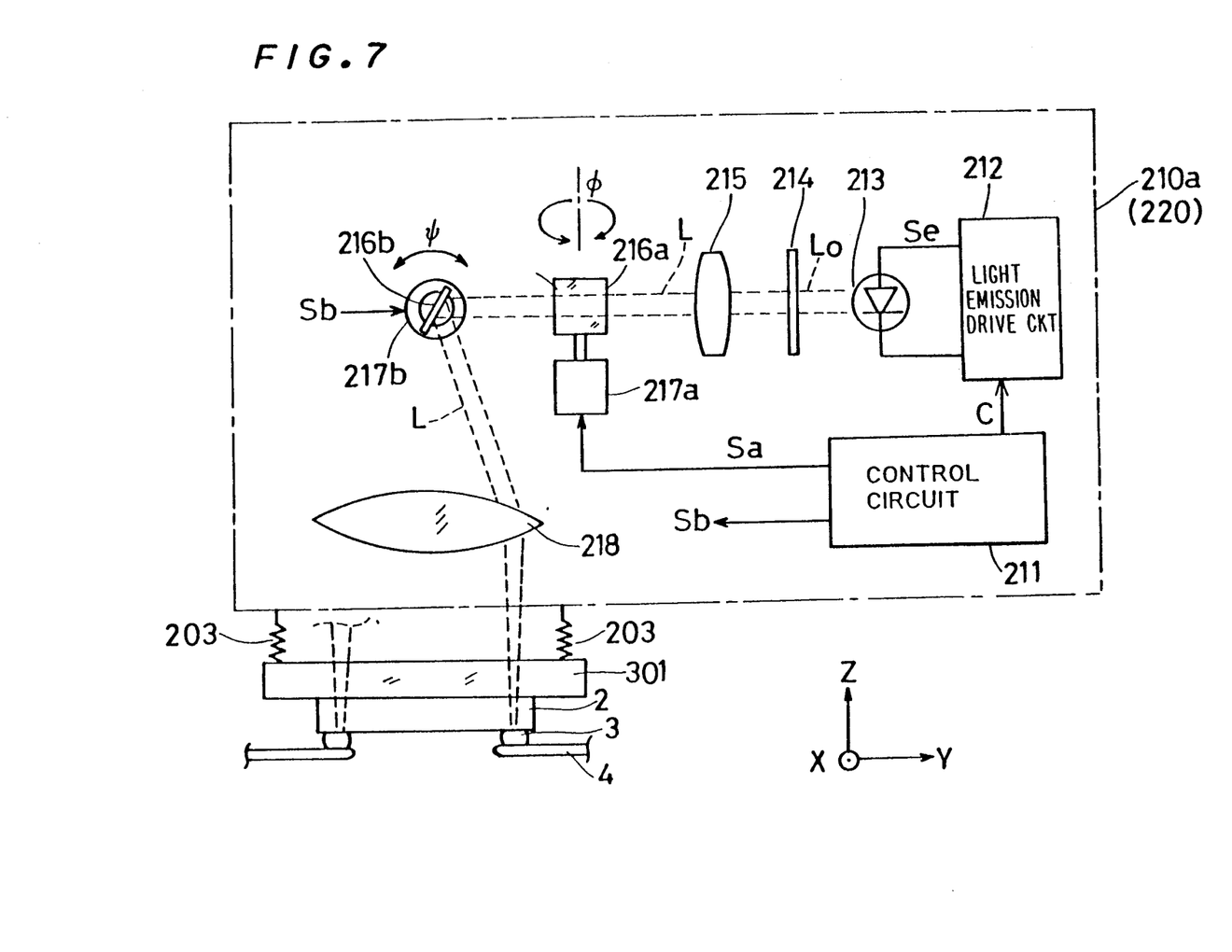
FIG. 7 is a schematic view showing an inner portion of an infrared light illumination device.

FIG. 7 is a view of an infrared light illumination device 210a of the selective illumination type which can be used as the infrared light illumination device 210 of FIG. 2. The infrared light illumination device 210a is housed in the optical head 220 of FIG. 2. However, circuits 211 and 212 (described later) of the device 210a may be installed outside the optical head 220.

In FIG. 7, the device 210a includes a light emission source 213 which emits a light beam in response to a light emission drive signal Se which is received from the light emission drive circuit 212. An xenon lamp, a halogen lamp and a YAG laser may be used as the light emission source 213.

A light beam $L_O$ from the light emission source 213 passes through a filter 214 where only an infrared light component of the light beam $L_O$ is extracted. Thus, the infrared light component alone is allowed to a converging lens 215 and converged thereat into an infrared light beam L.

The infrared light beam L is reflected by a first galvano mirror 216a which is rotatable freely about an axis Z in the direction $\Phi$. Reflected by the first galvano mirror 216a, the direction of propagation of the infrared light beam L is deflected in the X-Y plane. The infrared light beam L then impinges on a second galvano mirror 216b, which is rotatable freely about an axis X in the direction $\Psi$. Reflected by the second galvano mirror 216b, the infrared light beam L is deflected in the Y-Z plane.

The galvano mirrors 216a and 216b are respectively linked to motors 217a and 217b. Hence, by controlling drive of the motors 217a and 217b, the propagation direction of the infrared light beam L from the second galvano mirror 216b is two-dimensionally deflected.

From the second galvano mirror 216b, the infrared light beam L enters and passes through an F$\theta$ lens 218, from which it will be illuminated onto one of the bumps 3 through the plate member 301 and the semiconductor chip 2.

Information about the locations of the respective bumps 3 is loaded in advance in the control circuit 211 of the infrared light illumination device 210. The control circuit 211 selects one of the bumps 3 (e.g., a bump 3a of FIG. 8) and sends motor drive signals Sa and Sb which regulate the infrared light beam L to target the selected bump.

In synchronism with this, the control circuit 211 outputs a light emission control signal C to the light emission drive circuit 212 to thereby turn on a light beam from the light emission source 213. Thus, the infrared light beam L is illuminated onto the bump 3a.

FIG. 9 shows the infrared light beam L as it is illuminated onto one of the bumps 3. The diameter D of the bump 3 is usually about 50 Mm. On the other hand, the diameter d of the infrared light beam L on the bump 3 is, for example, 30 $\mu$m. Since the diameter d of the infrared light beam L is smaller than the diameter D of the bump 3, the infrared light beam L is prevented from illuminating an area other than the bump 3 even if an accuracy of registering the semiconductor chip 2 and an accuracy of deflecting the infrared light beam L include an error. In most cases, the bumps 3 are made of alloy such as a solder, and hence are highly thermally conductive. Hence, the infrared light beam L on only a portion of the bump 3 will cause that heat developed at that portion quickly spreads to other portions of the bump 3. For this reason, illumination of the infrared light beam L onto only a portion of the bump 3 has no problem in terms of melting the bump 3.

Figure 10:
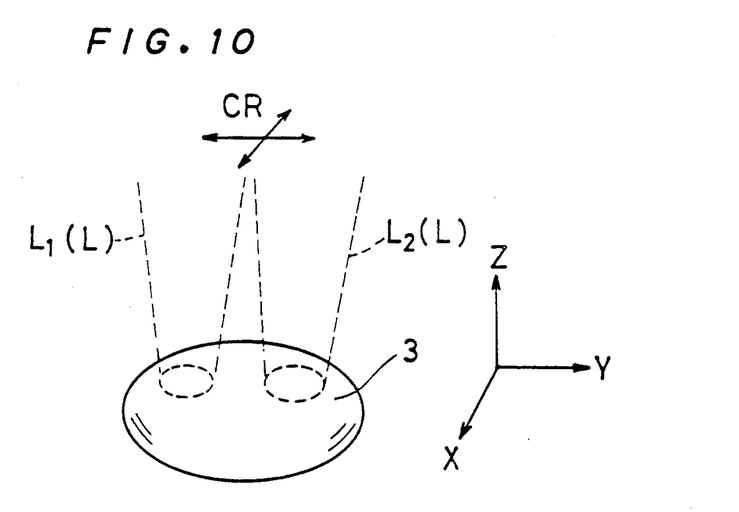
FIG. 10 is a view showing how a bump is scanned by an infrared light beam.

Differently from the example of FIG. 9, the diameter d of the infrared light beam L on the bump 3 may be further reduced as shown in FIG. 10. In this case, the infrared light beam L is scanned on the bump 3 in two-dimension. The two-dimensional scanning is conceptually shown by a cross mark CR in FIG. 10. For easy understanding of the scanning, the infrared light beam L at different times is shown as beams L1 and L2 in FIG. 10.

When such two-dimensional scanning is desired, the control circuit 211 needs to be equipped with a circuit which generates an oscillatory waveform which is to be given to the signals Sa and Sb of FIG. 7.

The infrared light beam L does not have to necessarily sweep on the bump 3, but may be irradiated like a spotlight which is directed onto the bump 3 at different positions in the X-Y plane within the bump 3.

Both the two-dimensional scanning and the spotlight-like irradiation are adaptive to where the bumps 3 have different sizes or stripe-like configurations. The bumps 3 of such sizes and configurations can be properly melted.

After completing irradiation of the infrared light beam L onto the bump 3a, the signal Sa and/or the signal Sb are changed so that the infrared light beam L moves to the next bump 3 (e.g., a bump 3b of FIG. 8). During the travel of the infrared light beam L from the bump 3a to the bump 3b, the signal Se of FIG. 8 is preferably disabled in synchronism with drive of the galvano mirrors 216a and 216b to thereby interrupt the light emission from the light emission source 213.

The signal Se is turned on when the infrared light beam L is deflected for readiness to illuminate the bump 3b, starting irradiation onto the bump 3b in a similar manner to that onto the bump 3a. This chain of operations is repeated in the course of which the bumps 3 are serially irradiated one by one along a route A of FIG. 8 along which the bumps 3 are arranged, thus completing the bonding.

Since the semiconductor chip 2 is urged towards the leads 4 by its own weight and the plate member 301 which is biased by the springs 203 (FIG. 2), a lead which corresponds to the bump 3a is bonded to the semiconductor chip 2 upon melting of the bump 3a. Hence, after irradiation onto the bump 3a, although the temperature of the bump 3a decreases during subsequent irradiation of the infrared light beam L onto the next bump 3b, no problem due to the temperature fall of the bump 3a will arise.

b. Total Illumination Type

Figure 11:
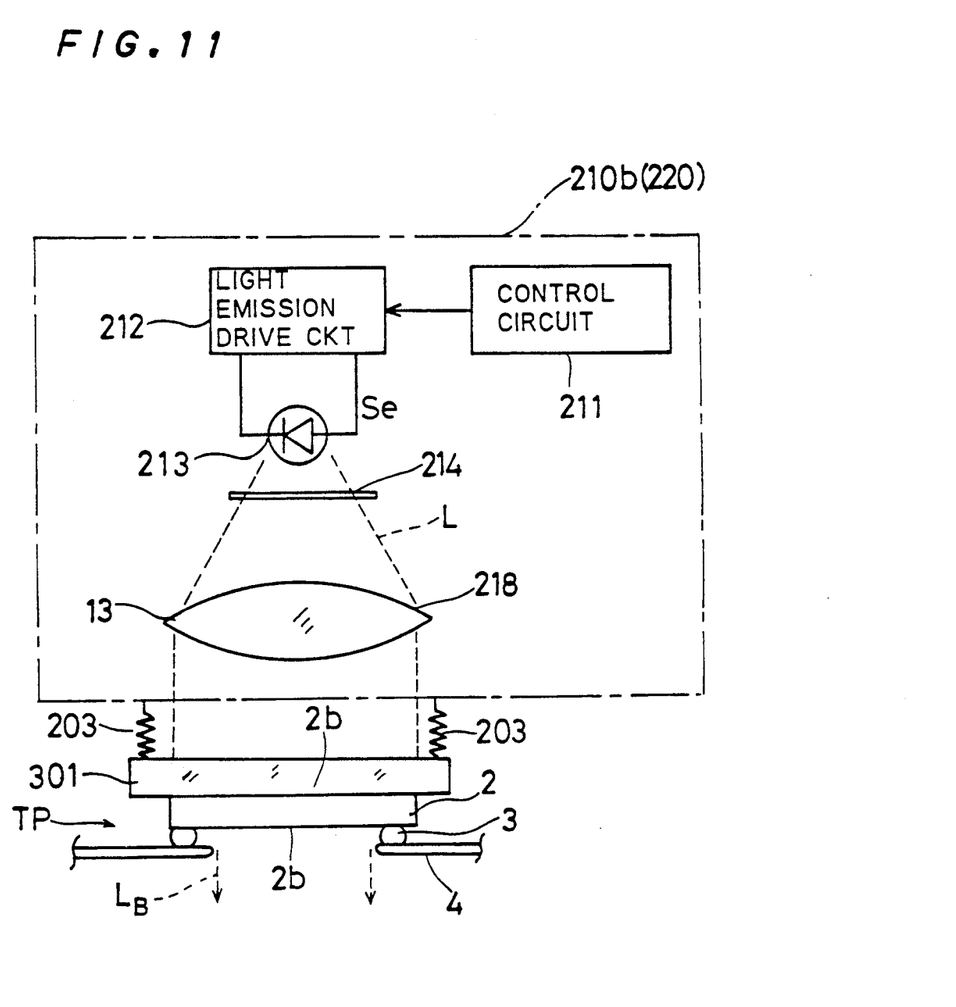
FIG. 11 is a schematic view showing an inner portion of another example of the infrared light illumination device.

FIG. 11 is a view of an infrared light illumination device 210b of the total illumination type. Comparison between FIGS. 7 and 11 clearly shows that the device 210b includes neither converging lens nor galvano mirror. The infrared light beam L from the light emission source 213 through the filter 214 is directed to the Fθ lens 218, and irradiated therefrom towards the entire area of the second major surface 2b of the semiconductor chip 2. Then, transmitted by the plate member 301 and the semiconductor chip 2, a portion of the infrared light beam L reaches the bumps 3. Thus, elements for deflection and scanning of the infrared light beam L are simply unnecessary. In addition, the device 210b allows economy in time and completes bonding in a reduced time since it is capable of melting all the bumps 3 and hence capable of bonding all the leads 4 at a time by only one irradiation.

The fact that the support member 202 of FIG. 2 is made of a material which transmits or absorbs infrared light weighs a great significance especially when the device 210b of the total illumination type is used for bonding. The reason is as follows.

In the device 210b, a component of the infrared light beam L which is irradiated onto the semiconductor chip 2 at a center portion of the major surface 2b is not absorbed by the bumps 3. Having failed to be absorbed by the bumps 3, this component further advances to the support member 202 of FIG. 2 as a leak light beam $L_B$. Hence, if the support member 202 is made of a material which reflects infrared light, the light beam $L_B$ will be reflected by the support member 202 and returned to the semiconductor chip 2. Although silicon, the material of the semiconductor chip 2, transmits infrared light which passes therethrough, the transmission rate is not exactly 100%. This means that the infrared reflection light beam may increase the temperature of the semiconductor chip 2 in some cases.

On the contrary, if the support member 202 is made of a material which transmits or absorbs infrared light, the temperature increase due to the reflection light beam will not occur. Thus, temperature rise of the semiconductor chip 2 is effectively prevented. The selection of the infrared-light-transmittable or -absorbable material for the support member 202 is meaningful even when the device 210a of FIG. 7 is used as the infrared light illumination device 210, since the effect as above becomes important if the infrared light beam L is to be left turned on during its travel from the bump 3a to the next bump 3b.

2. Second Preferred Embodiment

The present invention is also applicable to the flip-chip style mounting of a semiconductor chip on a board such as a print wiring board.

Figure 12:
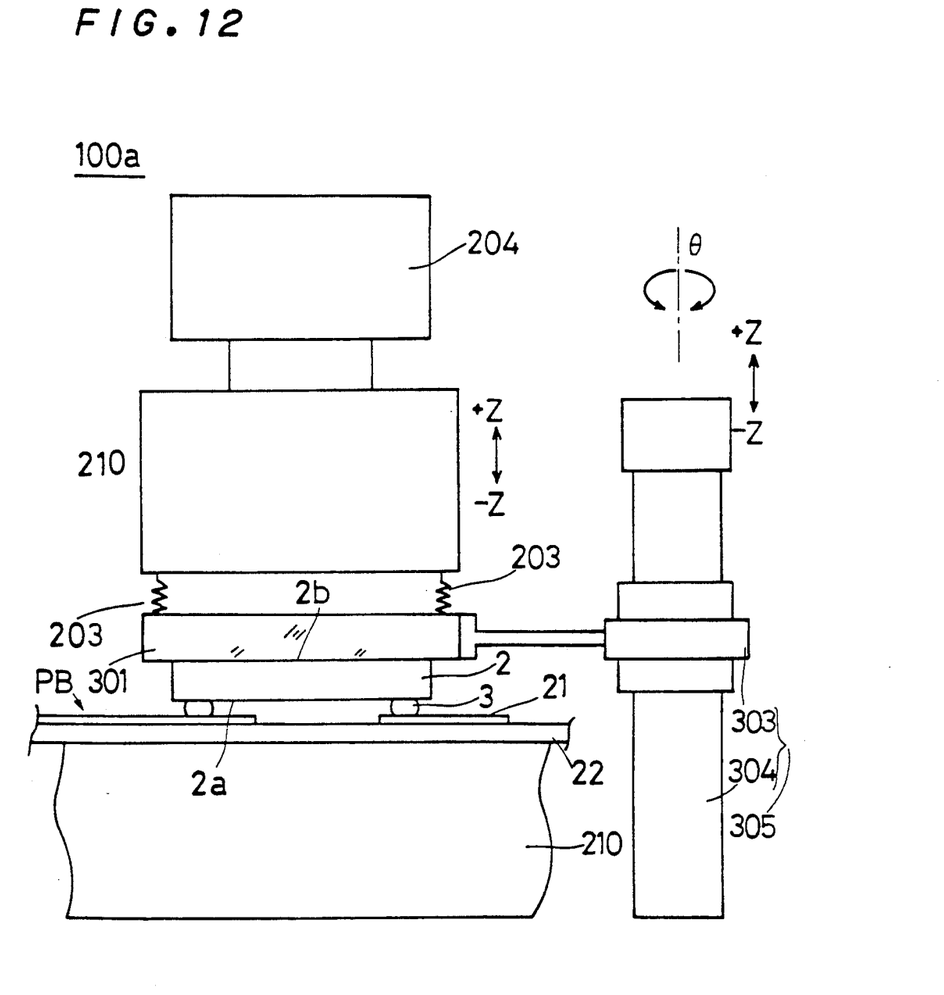
FIG. 12 is a schematic view of a bonding apparatus according to a second preferred embodiment of the present invention.

FIG. 12 is a view of an apparatus 100a which is suitable for the flip-chip style mounting. In the flip-chip style mounting using the apparatus 100a, an object to be bonded is a print board PB in which conductive land patterns 21 are formed on an insulation substrate 22. The print board PB has a connection pattern for connecting the land patterns and a through hole which is bored through the insulation substrate 22; however, these elements are omitted in FIG. 12.

The apparatus 100a is similar to the apparatus 100 of FIG. 2 in terms of structure and operation. Hence, similar description will not be repeated.

Figure 13:
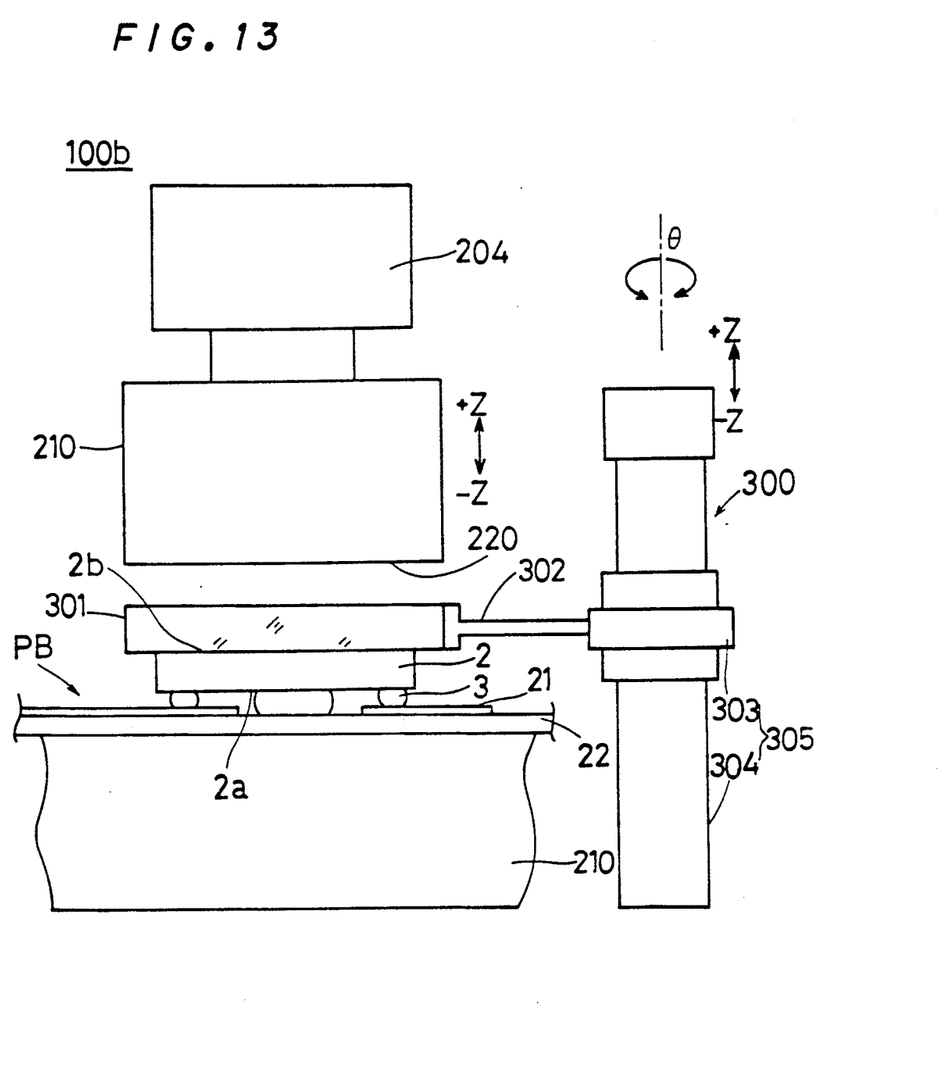
FIG. 13 is schematic view of another example of the bonding apparatus of the second preferred embodiment of the present invention.

An apparatus 100b as shown in FIG. 13, or the apparatus 100a modified to omit the springs, may be otherwise used. The apparatus 100b requires that an adhesive 23 is applied on the insulation substrate 22 to temporarily hold the semiconductor chip 2 on the insulation substrate 22. Owing to the provision of the adhesive 23, the semiconductor chip 2 is prevented from getting misaligned to the land patterns 21.

3. Comparison of the Invention with Other Technique and Expedient of the Invention (1) In the bonding apparatuses 100 and 100a, instead of the springs 203, vacuum force may be used to press the semiconductor chip 2 against an object to be bonded. To this end, a vacuum path is provided which intercepts the top surface of the support member 202. By applying negative vacuum pressure onto the semiconductor chip 2 through the vacuum path, the semiconductor chip 2 is pulled toward the object to be bonded.

(2) Differently from the conventional technique which is illustrated in FIG. 1, the present invention eliminates the necessity of pressing the heated pressure tool against a semiconductor chip. Hence, it is possible that the structures of FIGS. 2, 11 and 12 may be placed up side down. That is, the present invention can deal with both the face-down bonding and the face-up bondings.

(3) It is possible in conventional bonding techniques that infrared light is irradiated onto the semiconductor chip 2 at the first major surface 2a and not at the second major surface 2b. This approach, however, should be definitely avoided if an object to be bonded (such as the TAB tape TP and the print board PB) is not translucent to infrared light.

In the present invention, on the contrary, since an infrared light beam is illuminated from the major surface 2b side of the semiconductor chip 2, i.e., from a side where an object to be bonded is not placed, the object to be bonded needs not to be transparent to infrared light. Thus, the present invention has a wide applicable field.

While the invention has been described in detail, the foregoing description is in all aspects illustrative and not restrictive. It is understood that numerous other modifications and variations can be devised without departing from the scope of the invention.

We claim:

1. A method of bonding a semiconductor chip to an object to be bonded, said semiconductor chip having first and second major surfaces, said object to be bonded including a conductive member, said method comprising the steps of:
   (a) supporting said object to be bonded and said semiconductor chip in such a manner that said first major surface of said semiconductor chip is faced with said conductive member through a bump interposed therebetween; and
   (b) illuminating an infrared light beam from a second major surface side of said semiconductor chip onto said bump through said semiconductor chip.

2. The method of claim 1, wherein said step (b) includes the steps of:
   (b-1) generating said infrared light beam; and
   (b-2) deflecting said infrared light beam towards said bump.

3. The method of claim 2, wherein an array of bumps is formed on said first major surface of said semiconductor chip and said step (b) further includes a step of (b-3) scanning said infrared light beam on said bumps one by one serially.

4. The method of claim 3, wherein said step (b-3) includes a step of (b-3-1) enabling said infrared light beam during first periods in which said infrared light beam is irradiated onto either one of said bumps and disabling said infrared light beam during second periods in which said infrared light beam is moving between said bumps.

5. The method of claim 4, wherein said step (b) further includes a step of (b-4) pressing said semiconductor chip towards said conductive member before said steps (b-1) and (b-2).

6. The method of claim 5, wherein said step (b) further includes a step of (b-5) converging said infrared light beam by a converging optical system onto said array of said bumps.

7. The method of claim 6, wherein said step (b-5) further includes a step of (b-5-1) converging said infrared light beam so that on said bumps, said infrared light beam has a diameter equal to or smaller than the diameter of each of said bumps.

8. The method of claim 7, wherein said step (b-5-1) further includes a step of converging said infrared light beam so that on said bumps, said infrared light beam has a smaller diameter than the diameter of each of said bumps, and wherein said step (b-3-1) includes a step of (b-3-1a) two-dimensionally scanning said infrared light beam on each of said bumps during said first periods.

9. The method of claim 8, further comprising a step of (d) moving a plate member which is made of a material which transmits said infrared light beam and mounting said plate member on said second surface of said semiconductor chip before said step (b).

10. The method of claim 9, wherein said step (a) includes a step of (a-1) mounting said object to be bonded and said semiconductor chip on a support member which is made of a material which transmits or absorbs said infrared light beam.

11. The method of claim 10, wherein said object to be bonded includes an insulation tape and a plurality of leads which are placed on said insulation tape and wherein said conductive member is said plurality of leads.

12. The method of claim 4, wherein said object to be bonded includes an insulation substrate and a conductive pattern which is formed on said insulation substrate and wherein said conductive member is said conductive pattern.

13. A bonding apparatus for bonding a semiconductor chip which consists essentially of silicon to an object to be bonded which includes a conductive member, said semiconductor chip having first and second major surfaces, comprising:
   (a) support means for supporting said object to be bonded and said semiconductor chip in such a manner that said first major surface of said semiconductor chip is faced with said conductive through a bump interposed therebetween; and
   (b) infrared light beam illumination means for illuminating an infrared light beam from a second major surface side of said semiconductor chip onto said bump through said semiconductor chip.

14. The bonding apparatus of claim 13, wherein said infrared light beam illumination means includes:
   (b-1) infrared light beam generation means for generating said infrared light beam; and
   (b-2) beam deflection means for deflecting said infrared light beam towards said bump.

15. The bonding apparatus of claim 14, wherein an array of bumps is formed on said first major surface of said semiconductor chip, said bonding apparatus further comprising (c) control means for giving a deflection control signal to said beam deflection means to thereby scan said infrared light beam on said plurality of bumps one by one serially.

16. The bonding apparatus of claim 15, wherein said control means includes (c-1) means for generating a timing signal which is in synchronism with said deflection control signal and for giving said timing signal to said infrared light beam generation means so that said infrared light beam is enabled during first periods in which said infrared light beam is irradiated onto either one of said bumps and disabled during second periods in which said infrared light beam is moving between said bumps.

17. The bonding apparatus of claim 16, wherein said infrared light beam illumination means further includes:

(b-3) an optical head disposed in an opposed relation with said second major surface of said semiconductor chip, said optical head emitting said infrared light beam which has been deflected by said beam deflection means towards said second major surface of said semiconductor chip;

(b-4) an elastic member attached to said optical head at a location off the optical path of said infrared light beam, said elastic member projecting towards said second major surface of said semiconductor chip; and (b-5) a mechanism for protracting and detracting said optical head towards and backwards from said second major surface of said semiconductor chip.

18. The bonding apparatus of claim 17, wherein said infrared light beam generation means includes:

(b-1-1) an infrared light beam source for generating said infrared light beam; and (b-1-2) a converging optical system for converging said infrared light beam onto each of said bumps.

19. The bonding apparatus of claim 18, wherein said converging optical system includes (b-1-2a) an optical element for converging said infrared light beam so that on said bumps, said infrared light beam has a diameter equal to or smaller than the diameter of each of said bumps.

20. The bonding apparatus of claim 19, wherein said optical system converges said infrared light beam so that on said bumps, said infrared light beam has a smaller diameter than the diameter of each of said bumps and wherein said control means includes (c-2) means for generating a deflection control signal under the control of which said infrared light beam is scanned on each of said bumps two-dimensionally during said first periods.

21. The bonding apparatus of claim 20, further comprising a mechanism (d) which includes:

(d-1) a plate member which is made of a material which transmits said infrared light beam, said plate member being mountable on said second surface of said semiconductor chip; and (d-2) an actuator for moving said plate member onto said second surface of said semiconductor chip.

22. The bonding apparatus of claim 21, wherein said support means includes (a-1-1) a support member which is made of a material which transmits or absorbs said infrared light beam, said plate member mounting thereon said object to be bonded.

23. The bonding apparatus of claim 22, wherein said object to be bonded includes an insulation tape and a plurality of leads which are placed on said insulation tape and wherein said conductive member is said plurality of leads.

24. The bonding apparatus of claim 16, wherein said object to be bonded includes an insulation substrate and a conductive pattern which is formed on said insulation substrate and wherein said conductive member is said conductive pattern.

* * * * *